United States Patent
Yin et al.

(10) Patent No.: US 10,580,483 B1
(45) Date of Patent: Mar. 3, 2020

(54) MEMORY CELL

(71) Applicant: Guangzhou Tyrafos Semiconductor Technologies Co., LTD, Guangzhou (CN)

(72) Inventors: Ping-Hung Yin, Taipei (TW); Jia-Shyang Wang, Miaoli County (TW)

(73) Assignee: Guangzhou Tyrafos Semiconductor Technolgies Co., LTD, Guangzhou (CN)

( * ) Notice: Subject to any disclaimer, the term of this patent is extended or adjusted under 35 U.S.C. 154(b) by 0 days.

(21) Appl. No.: 16/274,263

(22) Filed: Feb. 13, 2019

(30) Foreign Application Priority Data

Oct. 5, 2018 (TW) .............................. 107135207 A

(51) Int. Cl.
*G11C 11/412* (2006.01)
*H01L 27/11* (2006.01)
*G11C 11/419* (2006.01)

(52) U.S. Cl.
CPC .......... *G11C 11/412* (2013.01); *G11C 11/419* (2013.01); *H01L 27/1104* (2013.01)

(58) Field of Classification Search
CPC .. G11C 11/412; G11C 11/419; H01L 27/1104
See application file for complete search history.

(56) References Cited

U.S. PATENT DOCUMENTS

| | | | |
|---|---|---|---|
| 7,920,409 B1 * | 4/2011 | Clark | G11C 11/412 365/154 |
| 2001/0033511 A1 * | 10/2001 | Saito | G11C 11/412 365/174 |

\* cited by examiner

*Primary Examiner* — Karen Kusumakar

(74) *Attorney, Agent, or Firm* — JCIPRNET

(57) ABSTRACT

A memory cell including a first transistor, an inverter, and a second transistor is provided. A first terminal of the first transistor serves as a data input terminal of the memory cell. A control terminal of the first transistor receives a write control signal. A second terminal of the first transistor is coupled to a memory node. An input terminal of the inverter is coupled to the memory node. An output terminal of the inverter serves as a data output terminal of the memory cell. A first terminal of the second transistor is coupled to a first voltage. A control terminal of the second transistor is coupled to the output terminal of the inverter. A second terminal of the second transistor is coupled to the memory node. A body of the second transistor is coupled to a second voltage. A voltage value of the second voltage is not equal to a voltage value of the first voltage to reduce a leakage current of the second transistor.

8 Claims, 2 Drawing Sheets

200

MEMORY CELL

CROSS-REFERENCE TO RELATED APPLICATION

This application claims the priority benefit of Taiwan application serial no. 107135207, filed on Oct. 5, 2018. The entirety of the above-mentioned patent application is hereby incorporated by reference herein and made a part of this specification.

BACKGROUND

Technical Field

The invention relates to a memory cell. More particularly, the invention relates to a memory cell capable of improving a leakage current condition.

Description of Related Art

In the deep sub-micron technology, the leakage current problem found in transistors has become a critical and not negligible problem. In particular, in memory cells designed based on transistors, a leakage current may cause an error in data stored in the memory cells. Therefore, how to improve the problem of leakage current in memory cells is an important issue in this field.

SUMMARY

Accordingly, the invention provides a memory cell capable of improving the leakage current condition.

A memory cell provided by an embodiment of the invention includes a first transistor, an inverter, and a second transistor. A first terminal of the first transistor is configured to serve as a data input terminal of the memory cell. A control terminal of the first transistor receives a write control signal. A second terminal of the first transistor is coupled to a memory node. An input terminal of the inverter is coupled to the memory node. An output terminal of the inverter is configured to serve as a data output terminal of the memory cell. A first terminal of the second transistor is coupled to a first voltage. A control terminal of the second transistor is coupled to the output terminal of the inverter. A second terminal of the second transistor is coupled to the memory node. A body of the second transistor is coupled to a second voltage. A voltage value of the second voltage is not equal to a voltage value of the first voltage to reduce a leakage current of the second transistor.

In an embodiment of the invention, the second transistor is a P-type metal oxide semiconductor field effect transistor, the first voltage and the second voltage are positive voltages, and the voltage value of the second voltage is greater than the voltage value of the first voltage.

In an embodiment of the invention, the first transistor is an N-type metal oxide semiconductor field effect transistor, and a body of the first transistor is coupled to a negative voltage.

In an embodiment of the invention, the first transistor is an P-type metal oxide semiconductor field effect transistor, and a body of the first transistor is coupled to the second voltage.

In an embodiment of the invention, the second transistor is an N-type metal oxide semiconductor field effect transistor, the first voltage is a ground voltage, and the second voltage is a negative voltage.

In an embodiment of the invention, the first transistor is an P-type metal oxide semiconductor field effect transistor, and a body of the first transistor is coupled to a third voltage. The third voltage is a positive voltage, and a voltage value of the third voltage is greater than a voltage value of the data input terminal of the memory cell.

To sum up, in the memory cell provided by the embodiments of the invention, as the body effect of the transistor of the memory cell is enhanced, the leakage current between the transistor and the memory node is reduced, and that an error is effectively prevented from occurring in the data stored in the memory node.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
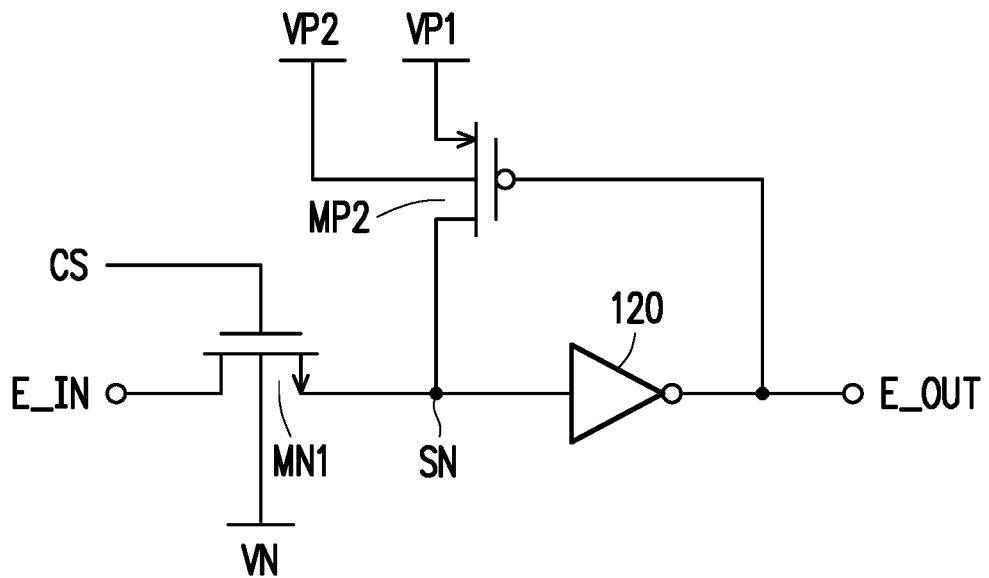
FIG. 1 is schematic diagram illustrating a circuit structure of a memory cell according to an embodiment of the invention.

In order to make the invention more comprehensible, several embodiments are described below as examples of implementation of the invention. In addition, wherever possible, identical or similar reference numerals stand for identical or similar elements/components in the drawings and the embodiments.

FIG. 1 is schematic diagram illustrating a circuit structure of a memory cell according to an embodiment of the invention. With reference to FIG. 1, a memory cell 100 includes a first transistor MN1, a second transistor MP2, and an inverter 120. A first terminal of the first transistor MN1 is configured to serve as a data input terminal E_IN of the memory cell 100, a control terminal of the first transistor MN1 receives a write control signal CS, and a second terminal of the first transistor MN1 is coupled to a memory node SN. Herein, the first transistor MN1 may be turned on by the write control signal CS, so as to write data of the data input terminal E_IN to the memory node SN. Further, after the data of the data input terminal E_IN is written to the memory node SN, the first transistor MN1 is turned off, so that the data is stored in the memory node SN.

An input terminal of the inverter 120 is coupled to the memory node SN. An output terminal of the inverter 120 is configured to serve as a data output terminal E_OUT of the memory cell 100. A first terminal of the second transistor MP2 is coupled to a first voltage VP1. A control terminal of the second transistor MP2 is coupled to the output terminal of the inverter 120. A second terminal of the second transistor MP2 is coupled to the memory node SN. A body of the second transistor MP2 is coupled to a second voltage VP2. In particular, in order to reduce a leakage current of the second transistor MP2, a voltage value of the second voltage VP2 is not equal to a voltage value of the first voltage VP1.

Specifically, in the embodiment shown in FIG. 1, the second transistor MP2 is a P-type metal oxide semiconductor field effect transistor, the first voltage VP1 and the second voltage VP2 are both positive voltages, and the voltage value of the second voltage VP2 is greater than the voltage value of the first voltage VP1. In this way, a body effect of the second transistor MP2 is enhanced, so that the leakage current flowing from the second transistor MP2 to the memory node SN is reduced and thus an error is prevented from occurring in the data stored in the memory node SN.

For instance, when the data stored in the memory node SN is logic low level data, the output terminal of the inverter 120 is at a logic high level. Therefore, the second transistor MP2 is in an off state, so the data stored in the memory node SN is kept at the logic low level. Nevertheless, if the leakage current of the second transistor MP2 is excessively great when the second transistor MP2 is in the off state, a voltage of the memory node SN may increase gradually to turn on the second transistor MP2 eventually through the inverter 120, so that the data stored in the memory node SN becomes logic high level data. Therefore, the leakage current flowing from the second transistor MP2 to the memory node SN is reduced by enhancing the body effect of the second transistor MP2, so that an error is effectively prevented from occurring in the data stored in the memory node SN.

In addition, in the embodiment shown in FIG. 1, the first transistor MN1 is an N-type metal oxide semiconductor field effect transistor, and a body of the first transistor MN1 is coupled to a negative voltage VN so that a body effect of the first transistor MN1 is enhanced, but the invention is not limited thereto. It could be understood that a leakage current between the first transistor MN1 and the memory node SN could be reduced by enhancing the body effect of the first transistor MN1, so that an error may also be effectively prevented from occurring in the data stored in the memory node SN.

In an embodiment of the invention, the inverter 120 may be implemented by adopting a complementary metal-oxide-semiconductor (CMOS) inverter, but the invention is not limited thereto. Since a CMOS inverter includes a P-type metal oxide semiconductor field effect transistor and an N-type metal oxide semiconductor field effect transistor, the memory cell 100 shown in FIG. 1 would be treated as a four-transistor (4T) memory cell.

Figure 2:
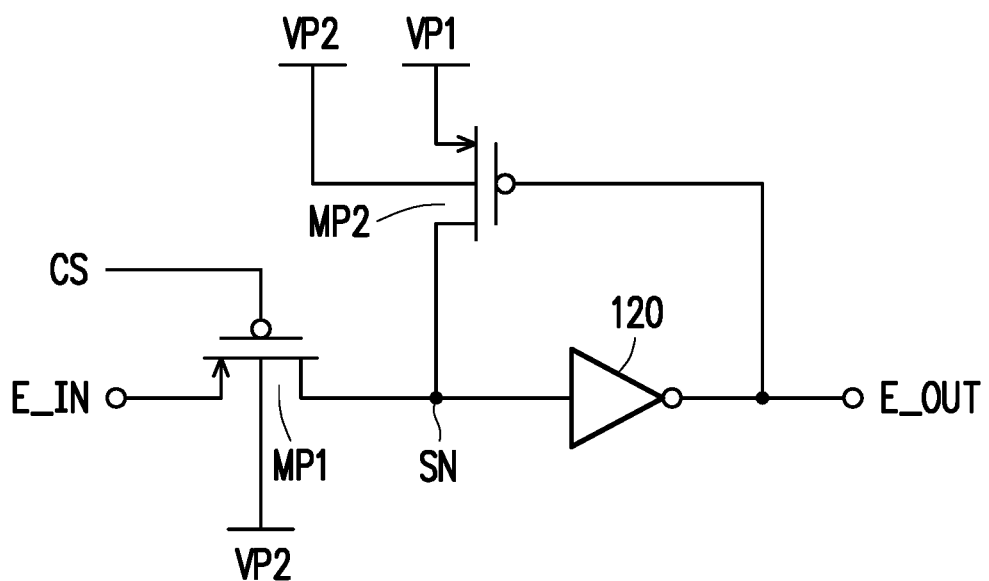
FIG. 2 is schematic diagram illustrating a circuit structure of a memory cell according to another embodiment of the invention.

FIG. 2 is schematic diagram illustrating a circuit structure of a memory cell according to another embodiment of the invention. With reference to FIG. 2, a memory cell 200 includes a first transistor MP1, a second transistor MP2, and an inverter 120. The memory cell 200 of FIG. 2 is similar to the memory cell 100 of FIG. 1, and a difference therebetween includes that: the first transistor MN1 of FIG. 1 is an N-type metal oxide semiconductor field effect transistor and the body of the first transistor MN1 is coupled to the negative voltage VN to reduce the leakage current between the first transistor MN1 and the memory node SN, while the first transistor MP1 of FIG. 2 is a P-type metal oxide semiconductor field effect transistor and a body of the first transistor MP1 is coupled to a second voltage VP2 to reduce a leakage current between the first transistor MP1 and a memory node SN. As the leakage current between the first transistor MP1 and the memory node SN is reduced, an error is effectively prevented from occurring in data stored in the memory node SN. In addition, other details and implementation related to the memory cell 200 of FIG. 2 may be found with reference to the related description of FIG. 1 and thus are not repeated herein.

Figure 3:
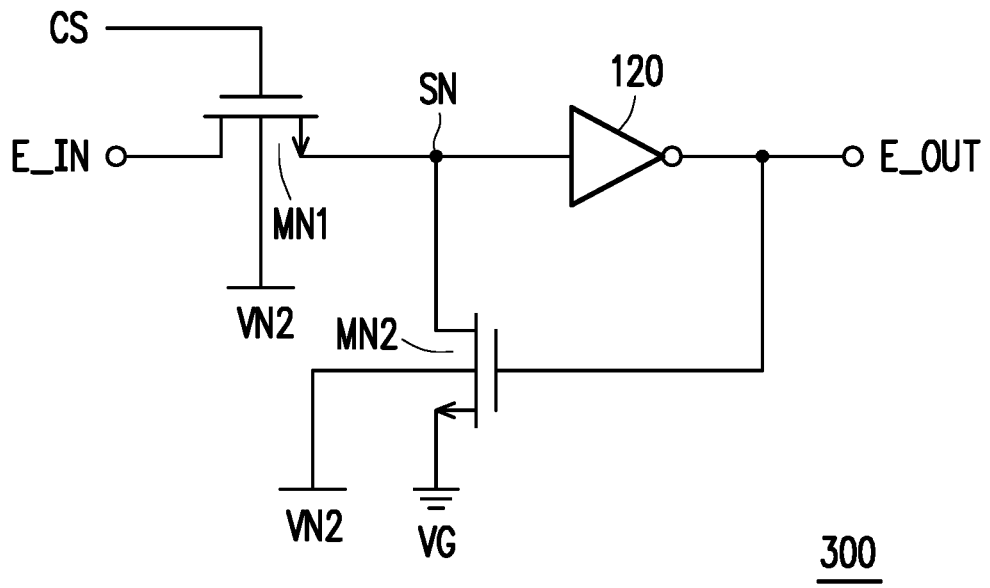
FIG. 3 is a schematic diagram illustrating a circuit structure of a memory cell according to still another embodiment of the invention.

FIG. 3 is a schematic diagram illustrating a circuit structure of a memory cell according to still another embodiment of the invention. With reference to FIG. 3, a memory cell 300 includes a first transistor MN1, a second transistor MN2, and an inverter 120. A first terminal of the first transistor MN1 is configured to serve as a data input terminal E_IN of the memory cell 300, a control terminal of the first transistor MN1 receives a write control signal CS, and a second terminal of the first transistor MN1 is coupled to a memory node SN. Herein, the first transistor MN1 may be turned on by the write control signal CS, so as to write data of the data input terminal E_IN to the memory node SN. Further, after the data of the data input terminal E_IN is written to the memory node SN, the first transistor MN1 is turned off, so that the data is stored in the memory node SN.

An input terminal of the inverter 120 is coupled to the memory node SN. An output terminal of the inverter 120 is configured to serve as a data output terminal E_OUT of the memory cell 300. A first terminal of the second transistor MN2 is coupled to a first voltage VG. A control terminal of the second transistor MN2 is coupled to the output terminal of the inverter 120. A second terminal of the second transistor MN2 is coupled to the memory node SN. A body of the second transistor MN2 is coupled to a second voltage VN2. In particular, in order to reduce a leakage current of the second transistor MN2, a voltage value of the second voltage VN2 is not equal to a voltage value of the first voltage VG.

Specifically, in the embodiment shown in FIG. 3, the second transistor MN2 is an N-type metal oxide semiconductor field effect transistor, the first voltage VG is a ground voltage, and the second voltage VN2 is a negative voltage. That is, the voltage value of the second voltage VN2 is less than the voltage value of the first voltage VG. In this way, a body effect of the second transistor MN2 is enhanced, so that the leakage current flowing from the memory node SN to the second transistor MN2 is reduced and thus an error is prevented from occurring in the data stored in the memory node SN.

For instance, when the data stored in the memory node SN is logic high level data, the output terminal of the inverter 120 is at a logic low level. Therefore, the second transistor MN2 is in an off state, so the data stored in the memory node SN is kept at the logic high level. Nevertheless, if the leakage current of the second transistor MN2 is excessively great when the second transistor MN2 is in the off state, a voltage of the memory node SN may decrease gradually to turn on the second transistor MN2 eventually through the inverter 120, so that the data stored in the memory node SN becomes logic low level data. As such, the leakage current flowing from the memory node SN to the second transistor MN2 is reduced by enhancing the body effect of the second transistor MN2, so that an error is effectively prevented from occurring in the data stored in the memory node SN.

In addition, in the embodiment shown in FIG. 3, the first transistor MN1 is an N-type metal oxide semiconductor field effect transistor, and a body of the first transistor MN1 is coupled to the second voltage VN2 (a negative voltage) to enhance a body effect of the first transistor MN1, but the invention is not limited thereto. It could be understood that a leakage current between the first transistor MN1 and the memory node SN could be reduced by enhancing the body effect of the first transistor MN1, so that an error may also be effectively prevented from occurring in the data stored in the memory node SN.

Figure 4:
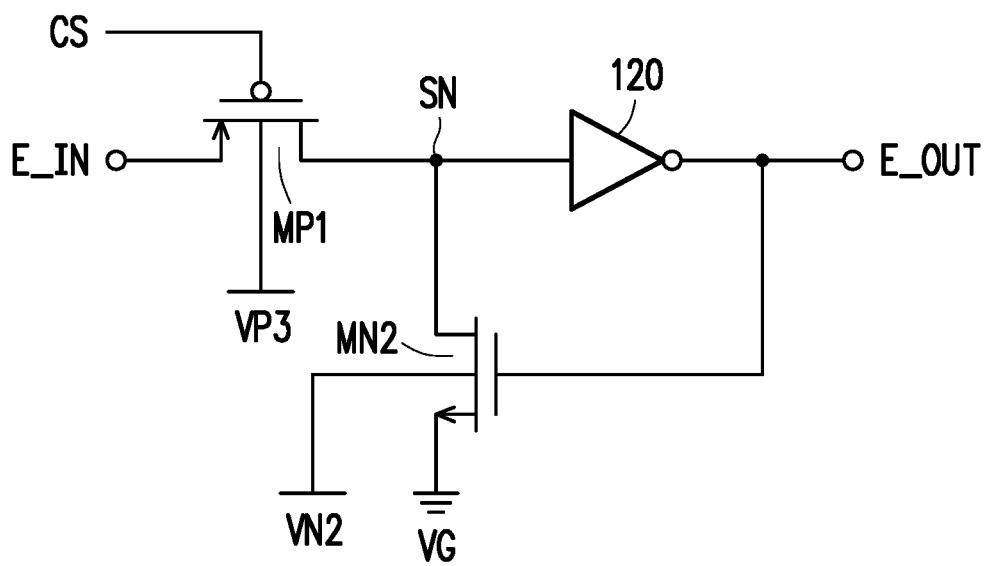
FIG. 4 is a schematic diagram illustrating a circuit structure of a memory cell according to still another embodiment of the invention.

FIG. 4 is a schematic diagram illustrating a circuit structure of a memory cell according to still another embodiment of the invention. With reference to FIG. 4, a memory cell 400 includes a first transistor MP1, a second transistor MN2, and an inverter 120. The memory cell 400 of FIG. 4 is similar to the memory cell 300 of FIG. 3, and a difference therebetween includes that: the first transistor MN1 of FIG. 3 is an N-type metal oxide semiconductor field effect transistor and the body of the first transistor MN1 is coupled to the second voltage VN2 (a negative voltage) to enhance the body effect of the first transistor MN1, while the first transistor MP1 of FIG. 4 is a P-type metal oxide semiconductor field effect transistor and a body of the first transistor MP1 is coupled to a third voltage (a positive voltage). In particular, a voltage value of the third voltage VP3 is greater than a voltage value of a data input terminal E_IN of the memory cell 400. In this way, a body effect of the first transistor MP1 may be enhanced, and a leakage current between the first transistor MP1 and a memory node SN is reduced, so that an error is effectively prevented from occurring in data stored in the memory node SN. Other details and implementation related to the memory cell 400 of FIG. 4 may be found with reference to the related description of FIG. 3 and thus are not repeated herein.

In view of the foregoing, in the memory cell provided by the embodiments of the invention, as the body effect of the transistor of the memory cell is enhanced, the leakage current between the transistor and the memory node is reduced, and an error is effectively prevented from occurring in the data stored in the memory node. In addition, the memory cell provided by the embodiments of the invention may substantially be treated as a 4T memory cell. Since a 4T memory cell features a simple circuit structure and a small circuit area, risks of production and manufacturing as well as hardware costs may be effectively lowered.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A memory cell, comprising:
  a first transistor, a first terminal of the first transistor configured to serve as a data input terminal of the memory cell, a control terminal of the first transistor receiving a write control signal, and a second terminal of the first transistor coupled to a memory node;
  an inverter, an input terminal of the inverter coupled to the memory node, and an output terminal of the inverter configured to serve as a data output terminal of the memory cell; and
  a second transistor, a first terminal of the second transistor coupled to a first voltage, a control terminal of the second transistor coupled to the output terminal of the inverter, a second terminal of the second transistor coupled to the memory node, and a body of the second transistor coupled to a second voltage,
  wherein a voltage value of the second voltage is not equal to a voltage value of the first voltage to reduce a leakage current of the second transistor.

2. The memory cell as claimed in claim 1, wherein the second transistor is a P-type metal oxide semiconductor field effect transistor, the first voltage and the second voltage are positive voltages, and the voltage value of the second voltage is greater than the voltage value of the first voltage.

3. The memory cell as claimed in claim 2, wherein the first transistor is an N-type metal oxide semiconductor field effect transistor, and a body of the first transistor is coupled to a negative voltage.

4. The memory cell as claimed in claim 2, wherein the first transistor is a P-type metal oxide semiconductor field effect transistor, and a body of the first transistor is coupled to the second voltage.

5. The memory cell as claimed in claim 1, wherein the second transistor is an N-type metal oxide semiconductor field effect transistor, the first voltage is a ground voltage, and the second voltage is a negative voltage.

6. The memory cell as claimed in claim 5, wherein the first transistor is an N-type metal oxide semiconductor field effect transistor, and a body of the first transistor is coupled to the second voltage.

7. The memory cell as claimed in claim 5, wherein the first transistor is a P-type metal oxide semiconductor field effect transistor, and a body of the first transistor is coupled to a third voltage, wherein the third voltage is a positive voltage, and a voltage value of the third voltage is greater than a voltage value of the data input terminal of the memory cell.

8. The memory cell as claimed in claim 1, wherein the inverter is a complementary metal-oxide-semiconductor inverter.

* * * * *